United States Patent
Kaskoun et al.

(10) Patent No.: US 6,409,073 B1
(45) Date of Patent: Jun. 25, 2002

(54) METHOD FOR TRANSFERING SOLDER TO A DEVICE AND/OR TESTING THE DEVICE

(75) Inventors: Kenneth Kaskoun; Erik Jung; Werner Budweiser, all of Berlin (DE)

(73) Assignee: Fraunhofer-Gesellschaft Zur Foerderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 09/743,739

(22) PCT Filed: Jul. 14, 1999

(86) PCT No.: PCT/EP99/05033

§ 371 (c)(1),
(2), (4) Date: Feb. 27, 2001

(87) PCT Pub. No.: WO00/04578

PCT Pub. Date: Jan. 27, 2000

Related U.S. Application Data (63) Continuation of application No. 09/116,140, filed on Jul. 15, 1998, now abandoned.

(51) Int. Cl.[7] .............................................. B23K 31/02
(52) U.S. Cl. ................................... 228/180.22; 228/245
(58) Field of Search .......................... 228/180.22, 245, 228/246, 248.1, 248.5, 256

(56) References Cited

U.S. PATENT DOCUMENTS

| | | | |
|---|---|---|---|
| 4,898,320 A | 2/1990 | Dunaway et al. | |
| 5,217,597 A | 6/1993 | Moore et al. | 205/123 |
| 5,219,117 A | 6/1993 | Lin | 228/253 |
| 5,289,631 A | 3/1994 | Koopman | 29/840 |
| 5,290,710 A | 3/1994 | Haj-Ali-Ahmadi et al. | 437/8 |
| 5,316,788 A * | 5/1994 | Dibble et al. | |
| 5,376,584 A * | 12/1994 | Agarwala | |
| 5,399,505 A | 3/1995 | Dasse et al. | 437/8 |
| 5,447,264 A | 9/1995 | Koopman et al. | 28/563 |
| 5,470,787 A | 11/1995 | Greer | 437/183 |
| 5,480,835 A * | 1/1996 | Carney et al. | |
| 5,492,266 A | 2/1996 | Hoebener et al. | 228/248.1 |
| 5,808,874 A | 9/1998 | Smith | 361/769 |

(List continued on next page.)

FOREIGN PATENT DOCUMENTS

| | | | | |
|---|---|---|---|---|
| JP | 56049543 A * | 5/1981 | | |
| JP | 59154035 | 9/1984 | | H01L/21/66 |
| JP | 01189942 | 7/1989 | | H01L/21/92 |
| JP | 5166880 | 7/1993 | | H01L/21/60 |
| JP | 6-326111 | 11/1994 | | H01L/21/321 |
| JP | 10209591 A * | 8/1998 | | |
| WO | WO 97/09740 | 3/1997 | | H01L/21/66 |

OTHER PUBLICATIONS

Hubacher, Eric, Known Good Die Test for C4 (or other) Bumped die, Jul. 1995, Technical Developments, vol. 25.

Primary Examiner—Ton Dunn
Assistant Examiner—Kiley Stoner
(74) Attorney, Agent, or Firm—Michael A. Glenn (57) ABSTRACT

A substrate (10, 80) includes a conductive layer (16, 82) which is non-wettable by solder. A solder receiving stud (22, 84) is formed on the conductive layer, preferably by plating. If used for transferring solder, a solder bump (32) is selectively formed on the solder receiving stud since the surrounding conductive layer is not wettable by the solder. A receiving substrate, such as a semiconductor device (100), is aligned with the substrate. The solder bump is heated to a liquidus state and the solder bump makes physical contact with a solder accepting stud (120) of the receiving substrate. Because the area of the solder accepting stud is larger than the area of the corresponding stud on the transfer substrate, the majority of the solder will transfer to the receiving substrate upon separation. Alternatively, the device could itself already have bumps formed thereon, in which case an unbumped substrate is used to test the device, and solder remains on the device upon separation.

10 Claims, 6 Drawing Sheets

U.S. PATENT DOCUMENTS

| | | | | |
|---|---|---|---|---|
| 5,825,093 | A | * | 10/1998 | Guo et al. |
| 5,986,459 | A | | 11/1999 | Fukaya et al. .............. 324/755 |
| 6,008,071 | A | * | 12/1999 | Karasawa et al. |
| 6,099,935 | A | * | 8/2000 | Brearley et al. |
| 6,111,321 | A | * | 8/2000 | Agarwala |
| 6,117,694 | A | * | 9/2000 | Smith et al. |
| 6,121,689 | A | * | 9/2000 | Capote et al. |
| 6,295,730 | B1 | * | 10/2000 | Akram |
| 6,153,505 | A | * | 11/2000 | Bolde et al. |
| 6,167,615 | B1 | * | 1/2001 | Ma et al. |

\* cited by examiner

FIG. 10

METHOD FOR TRANSFERING SOLDER TO A DEVICE AND/OR TESTING THE DEVICE

This application is a 371 of PCT/EP99/05033 filed Jul. 14, 1999 which is a continuation of U.S. Ser. No. 09/116,140 filed Jul. 15, 1998 now abandonned.

FIELD OF THE INVENTION

The present invention relates generally to solder transfer methods, and more particularly to a method for transferring solder to, for example, a semiconductor device, using a transfer substrate.

BACKGROUND OF THE INVENTION

Solder bumps are increasingly becoming a common means of electrically connecting a semiconductor die to its next level substrate. Various methods exist for forming solder bumps on a die, including electroplating, evaporative deposition, screen printing and discrete placement of individual solder balls. One problem common with all such techniques is a difficulty in testing the devices after bump formation.

Both functional testing and burn-in testing have traditionally been performed after the semiconductor die has been wire-bonded and packaged either in a molded plastic package or preformed ceramic package. The external package leads were used to make the necessary electrical connections for testing. With bumped die, an external package is often not used. For example, a bumped die may be sold directly to a customer for direct chip attach (DCA) to the customer's printed circuit board. In this situation, the semiconductor manufacturer must test the die without the luxury of having a leaded package.

One method of testing at the die level is to use probe needles or pins which make physical and electrical contact with input/output (I/O) pads of the device, usually while the die are still in wafer form. However, probing is more difficult once the device has been bumped. Not only is contact between the bumps and needles difficult to make, but damage to the bumps is possible. Furthermore, probe needles cannot practically be used during high-temperature testing (e.g. at burn-in) because of the needles tend to move too much, loosing electrical connection to the bumps during the test.

Another wafer-level testing method is to form a sacrificial conductive layer, such as copper, over the device and to use this conductive layer to test the device, for example as described in U.S. Pat. No. 5,399,505 by Dasse et al. A disadvantage of this technique is that as the wafer becomes larger and as device geometry pitches become smaller, it is difficult to establish routing connections to those die near the center of the wafer. One method of guaranteeing access to the center of the wafer is to employ multiple sacrificial conductive layers to route signals, but this significantly adds to the manufacturing cost of the wafer.

Another approach for testing unpackaged die is the use of test sockets which are specially designed for use with bare die. The primary disadvantages of this method are the high cost of each socket, and thus the test board cost, and the amount of time it takes to load and unload each socket on the board. Furthermore, such test sockets cannot be used to test devices at the wafer level thereby eliminating the ability to supply product in wafer form.

U.S. Pat. No. 5,447,264 by Koopman et al. discloses a method for testing bare die which uses a temporary testing substrate that also serves to transfer solder bumps to the device tested. Solder is electroplated through a via opening in a passivation layer of the temporary substrate, and into an etched trench underlying the via. The solder also extends onto the passivation layer adjacent to the via. The plated solder "islands" are then aligned to, and brought into physical contact with, the I/O pads of a semiconductor die. The composite structure is then heated and cooled to form a solid phase mechanical and electrical connection between the semiconductor device and the temporary substrate. Testing is performed, then a shearing or pulling force is applied between the device and the temporary substrate to cause the solder bump to fracture at the temporary substrate, leaving the solder on the I/O pads of the device. While the method disclosed in U.S. Pat. No. 5,447,264 has several advantages over the other prior art techniques mentioned, the method is limited to use with electroplated solder. Semiconductor manufacturers are continually try to reduce the cost of manufacturing, and therefore would prefer to use a less costly solder deposition technique, such as screen printing. However, the method disclosed by Koopman is not conducive for use with a screen-printing process.

Therefore, a need exists for an improved method of testing semiconductor devices at the die or wafer level. Preferably, the testing method can be integrated into the solder bump formation process, as in U.S. Pat. No. 5,447,264, but the method should also be suitable for use with any type of solder deposition process.

DETAILED DESCRIPTION OF A PREFERRED EMBODIMENT

Generally, the present invention provides a transfer substrate for transferring solder to a device. The transfer substrate can also be used to test the device, either in die or wafer form. The transfer substrate includes a first conductive layer formed over an insulating layer. The first conductive layer provides the electrical interconnections needed for testing, and can serve as a seed layer for a second conductive layer, which is non-wettable by solder. Alternatively, a single conductive layer which is non-wettable by solder can be used if the layer is sufficiently conductive for purposes of electrical testing. A solder receiving stud is then formed on the uppermost conductive layer, where solder bumps are to be formed (e.g. in a pattern which matches the I/O pattern of the device to be bumped and tested).

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated. Also, like reference numerals may be used to designate identical or corresponding parts throughout the several views. As used in the description of the invention, a conductive material or layer refers to electrical conductivity, rather than thermal conductivity. Similarly, an insulating material or layer refers to a material's inability to conduct electrical current, as opposed to being thermally insulating. This does not imply, however, that a electrically conductive layer conductive layer cannot also be thermally conductive, or that an electrically insulating layer cannot also be thermally insulative.

Figure 1:
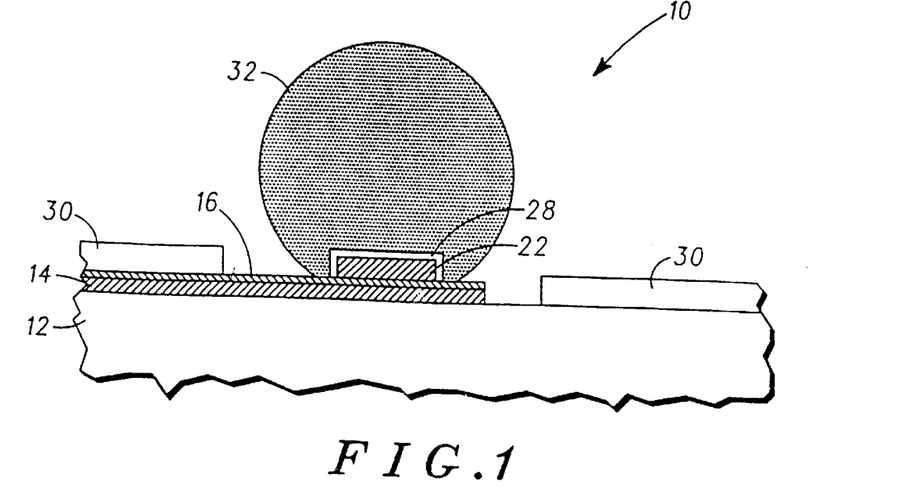
FIG. 1 is a cross-sectional illustration of a portion of solder transfer substrate in accordance with one embodiment of the present invention.

FIG. 1 illustrates, in a partial cross-sectional view, a transfer substrate 10 in accordance with one embodiment of the present invention. A method for making this substrate is later described in reference to FIGS. 3–6, where preferred materials for each of the elements are also discussed. Transfer substrate 10 includes an underlying substrate material 12, on which a first conductive layer 14 and a second conductive layer 16 are formed. A solder receiving stud 22 is formed on a portion of second conductive layer 16, matching the I/O pattern of the device to be bumped and/or tested. A diffusion barrier layer 28 is formed over the solder receiving stud 22 to prevent diffusion of the stud material into a solder bump 32. An optional passivation layer 30 can be included on the transfer substrate as a means of protecting the substrate from mechanical damage, but such layer is not needed for purposes of forming bump 32.

Figure 2:
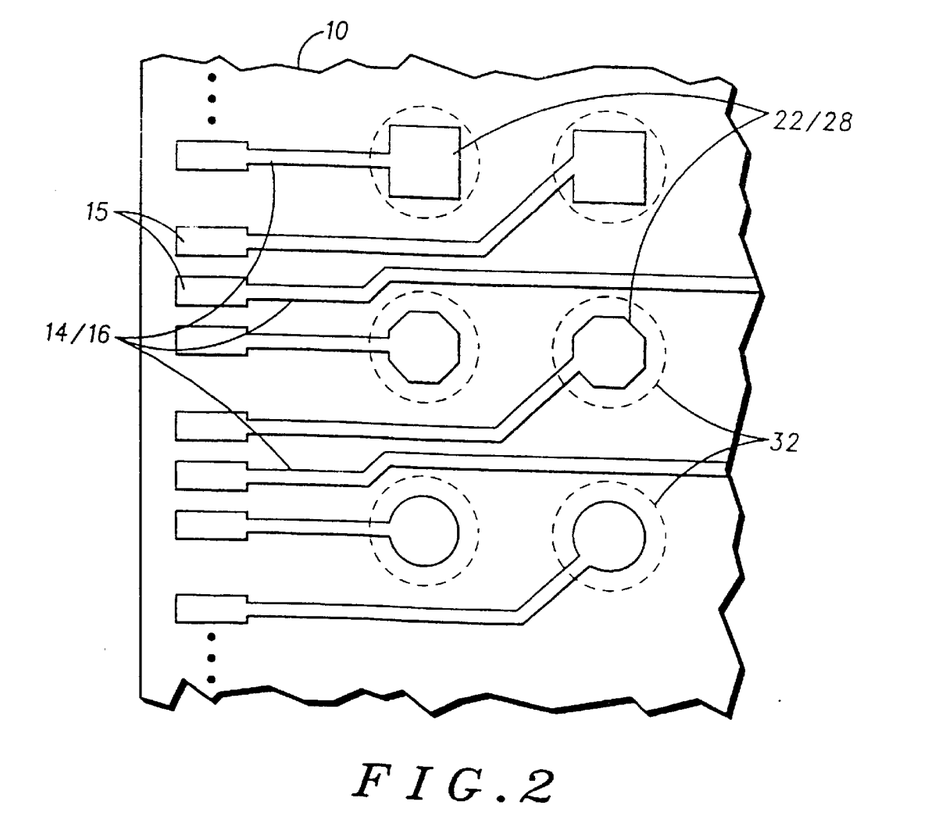
FIG. 2 is a top-down view of a portion of the solder transfer substrate of FIG. 1.

FIG. 2 illustrates a top-down view of a portion of transfer substrate 10. Conductive layers 14 and 16 are patterned to form conductive traces which route the solder receiving studs 22 to test contact pads 15 along the exterior edge of the transfer substrate. As shown, receiving studs 22 have different shapes. In practice, however, all studs are likely to be patterned in the same shape. The illustration in FIG. 2 is intended to show that the particular shape of the defined stud is not restricted by the present invention. Studs 22 define the area onto which solder bumps will be formed. Because the bumps will take on a spherical shape at some point (during either substrate manufacture, device test, or solder bump transfer) due to reflow of the solder, as shown by the dashed lines in FIG. 2 representing solder bumps 32, a circular or octagonal shape for the studs is preferable.

Figure 3:
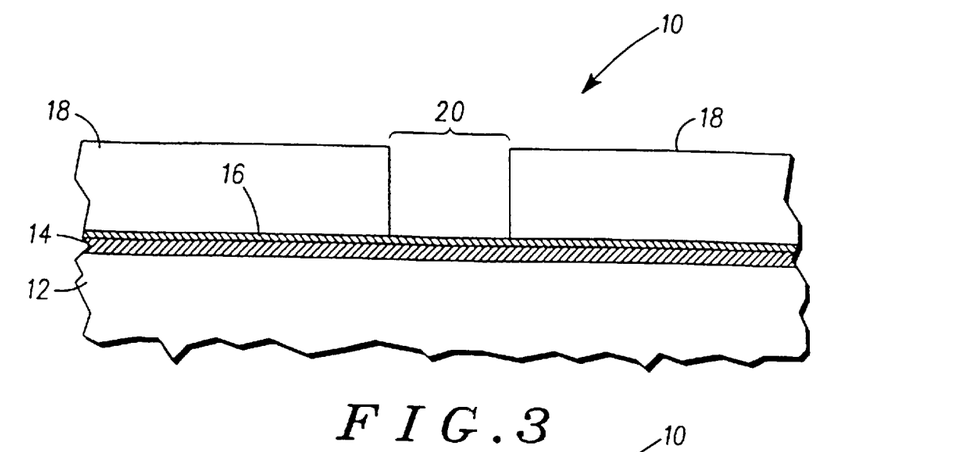
FIGS. 3–6 are a series of cross-sectional illustrations demonstrating one suitable method for forming the solder transfer substrate of FIG. 1, also in accordance with the present invention.

Referring now to a process for making transfer substrate 10, FIG. 3 shows a basic structure suitable for forming the relevant elements of the transfer substrate. A suitable underlying substrate material 12 is first provided. In a preferred formed, underlying substrate material 12 is a rigid substrate formed of glass. A rigid substrate material is preferred for purposes of maintaining planarity during the testing and bump transfer process, and for easier reusability of the transfer substrate, as further described below. Glass is a preferred material for its relatively inexpensive cost, its ability to withstand high temperatures, and the similarity of its coefficient of thermal expansion (CTE) with devices to be bumped. Silicon will also provide these advantages. It is noted, however, that non-rigid, non-glass structures can nonetheless be used. Also, while substrate material 12 is illustrated as a single material, it is important to note that the underlying substrate material may be a multilayered substrate, including various conductive and non-conductive layers. This is particularly true if the transfer substrate will also be used for testing and will include test circuitry. Since these underlying layers are not important for purposes of understanding the present invention, underlying substrate material 12 is shown as a single material. However, it is noted that the uppermost surface of underlying substrate material 12 should be insulating so that subsequently deposited conductive layers are appropriately isolated.

First conductive layer 14 is then deposited over underlying substrate material 12 as a blanket layer, followed by a blanket deposition of second conductive layer 16 on first conductive layer 14. In this embodiment, first conductive layer 14 is used to establish good electrical characteristics of the conductive traces on the transfer substrate while second conductive layer is used to establish a solder non-wettable surface. While the thicknesses of these layers are not particularly important to the practice of the invention, the thickness of layer 14 will generally be thicker than that of layer 16. For example, layer 14 may be about 2–5 micrometers ($\mu$m) while layer 16 may be less than 1 $\mu$m or even less than 0.1 $\mu$m. In accordance with the present invention, the uppermost conductive layer (second conductive layer 16 in this case) is of a conductive material which is not wettable by the particular solder to be used for forming bumps. In one specific embodiment, the second conductive layer is titanium tungsten (TiW), which is non-wettable by lead-tin (Pb/Sn) solder compositions. In this embodiment, first conductive layer 14 is provided to provide good electrical conductivity for the traces since TiW is a relatively poor conductor. If using TiW for second conductive layer 16, a preferred material for first conductive layer 14 is copper, which is an excellent conductor. A single conductive material which is non-wettable by solder and by itself serves as a sufficient conductor could instead replace the combination of first and second conductive layers 14 and 16 for simplified manufacturing, as further discussed in reference to FIGS. 7–8 below.

After first and second conductive layers 14 and 16 are deposited, a resist mask 18 is defined in accordance with conventional lithography practice. After patterning, resist mask 18 includes an opening 20 which exposes a portion of the uppermost conductive layer (in this case second conductive layer 16). Opening 20 corresponds to the location where a solder receiving stud will be formed, thus the positioning of the opening should correspond to the desired position of the solder bump to be formed. The size or area of the opening, and thus the size or area of the stud to be formed therein, should be sufficient to establish a reliable connection of the desired sized solder bump to the transfer substrate. A suitable opening and stud diameter will be about 50 $\mu$m, for use in forming a solder bump with a diameter of 125 $\mu$m, resulting in a suitable stud area of about 2000 $\mu$m2. It is also noted that while only one opening is shown in FIG. 3, one skilled in the art will understand that the resist mask would be patterned to include an opening corresponding to the location of each solder bump to be formed.

Figure 4:
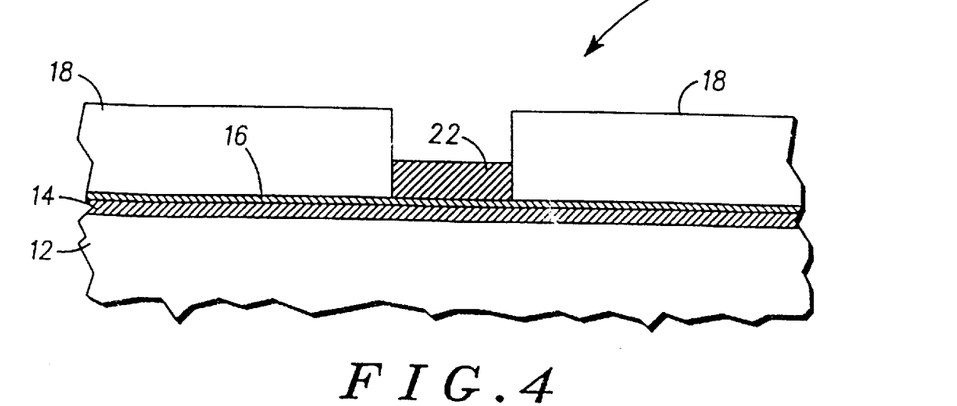

After defining the resist mask 18, solder receiving stud is formed within opening 20 as shown in FIG. 4. In this embodiment, solder receiving stud 22 is formed by electroplating copper (Cu), using the TiW material exposed within opening 20 as a seed. However, other materials can be used to form the stud if compatible with second conductive layer 16. Furthermore, the stud can be formed by another method, for example electroless plating. Electroplating is easily accomplished at this stage since first and second conductive layers 14 and 16 are unpatterned, making the application of an electrical bias to the exposed TiW material straightforward. Plating is continued until the desired stud thickness is achieved, for example to approximately 5–10 μm. The time required for achieving a suitable thickness will vary depending upon the particular plating bath concentration and electrical biasing conditions used.

Figure 5:
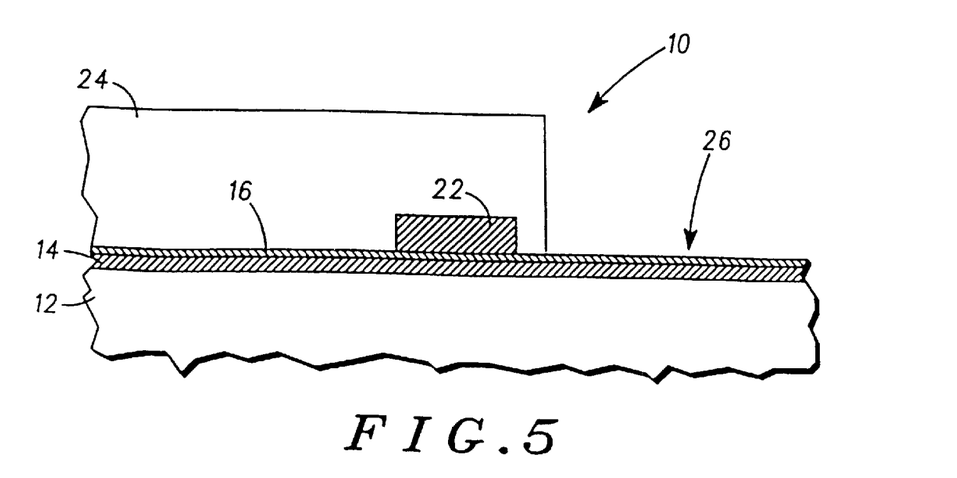

After forming solder receiving stud 22, resist mask 18 is removed in accordance with conventional methods and a new resist mask 24 is formed on transfer substrate 10, as shown in FIG. 5. Resist mask 24 is used to pattern the first and second conductive layers 14 and 16. The mask is formed so as to expose those portions of the conductive layers to be etched away, while protecting those portions which are to remain. Relative to FIG. 2, the portions of conductive layers 14 and 16 which remain are those underlying solder receiving studs 22, those which form test contact pads 15, and those which route the studs to the test contact pads. It is noted that the conductive layers usually need not extend beyond the studs in more than one direction. Thus, resist mask 24 as shown in FIG. 5 would ideally be aligned to the right most edge of solder receiving stud 22. However, some misalignment of the mask can be tolerated, as shown, since having the conductive layers extend beyond the stud on both sides does not create a problem.

Once resist mask 24 is in place, an appropriate etch is used to remove exposed portions of the first and second conductive layers 14 and 16. In the case of Cu as first conductive layer 14 and TiW as the second conductive layer 16, a series of wet etches is used, one to etch the TiW and another to etch the Cu. Conventional etch chemistries are used for these etches. After etching, resist mask 24 is removed.

Figure 6:
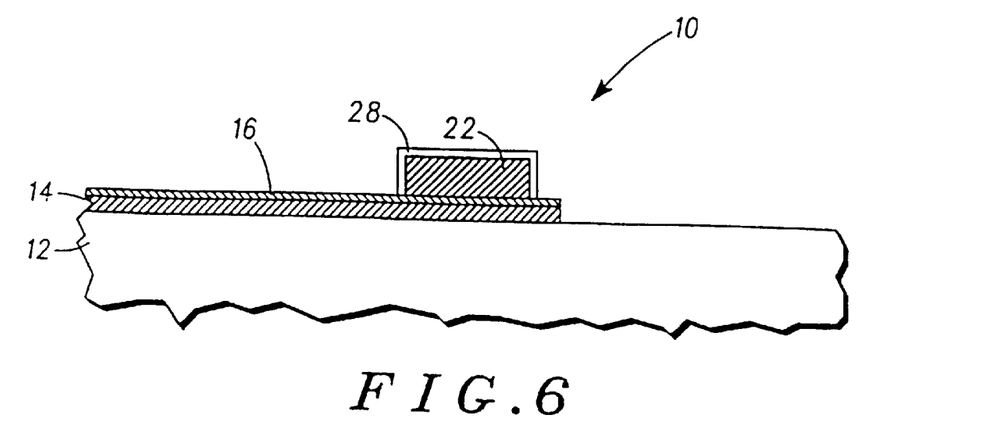

If using a material for solder receiving stud 22 which is soluble in the solder composition to be used, diffusion barrier layer 28 can be formed over the stud, as shown in FIG. 6. For example, Cu diffuses into Pb/Sn solder, so a thin layer of nickel (Ni) is electroless plated over the Cu stud, followed by a flash deposition of gold (Au) as an antoxidant. Any diffusion barrier material used must be wettable by the solder to be used, however the uppermost conductive layer (second conductive layer 16 in this example) must remain non-wettable by solder. Therefore, care should be taken to avoid deposition of a wettable diffusion barrier onto the non-wettable conductive layer. This can be accomplished by application of another resist mask to protect the non-wettable conductive layer during deposition of the diffusion barrier.

Transfer substrate 10 is now suitable for forming solder bumps on the solder receiving studs. Solder bump 32 is formed on each exposed solder receiving stud 22. In a preferred embodiment, the solder bumps are of Pb/Sn solder and formed using a screen printing process, although any solder deposition technique could be suitable. For example, the solder could be electroplated, evaporated, or formed as individual discrete balls by, e.g., a laser deposition process. Screen printing, however, is the least expensive alternative, and is therefore preferred. Other solder materials can also be used provided second conductive layer 16 is non-wettable to whatever solder composition is chosen. After reflow, the solder bumps will form on the solder receiving studs 22 as shown in FIG. 1. Because second conductive layer 16 is non-wettable by the solder, the bump only wets to the solder receiving stud 22.

Some manufacturers may prefer to include a passivation layer, like passivation layer 30 of FIG. 1, to protect the substrate from mechanical damage. The passivation layer could be formed at various stages in the process. For example, passivation could be deposited on the transfer substrate and patterned after solder receiving stud 22 has been formed and after conductive layers 14 and 16 have been patterned (e.g. after the step shown in FIG. 6). Naturally, the passivation layer must be patterned so as to expose the area where the solder bumps are to be formed. The size of openings formed in the passivation around the solder receiving stud, however, is not critical since these openings are not used to define the size of the solder bumps. Thus, the opening in any passivation layer can be larger in size than the solder bump to be formed therein. Alternatively, the passivation layer could be deposited and patterned prior to formation of the solder receiving stud 22. However, the passivation layer must be deposited after the conductive layers 14 and 16 are patterned.

Figure 7:
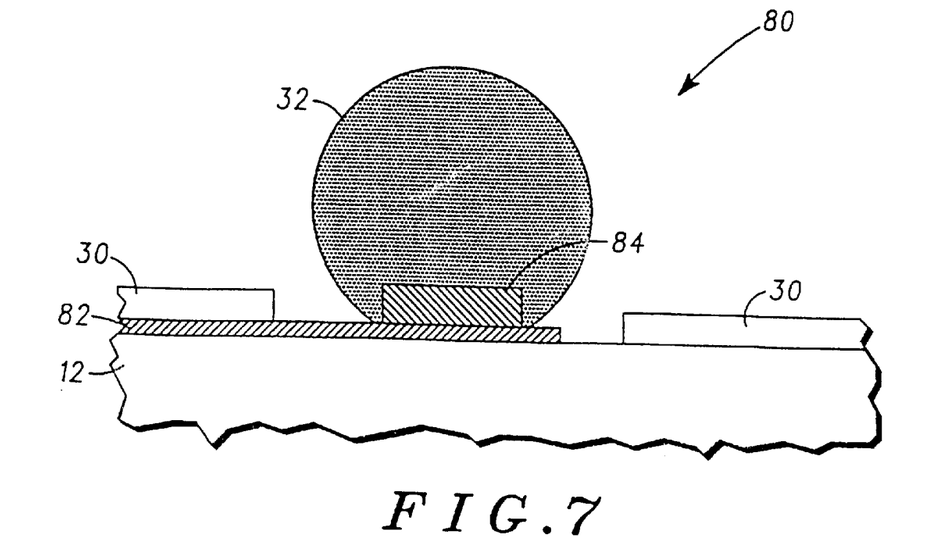
FIG. 7 illustrates, in cross-section, an alternative metallurgy scheme for forming a solder transfer substrate, also in accordance with the present invention.

The process described in reference to FIGS. 3–6 employs a first and a second conductive layer on the transfer substrate before forming the solder receiving studs because while TiW is a good, non-wettable conductive material, it is not a sufficiently good conductor for purposes of being used as the primary means of transmitting test signals. A disadvantage of using two such conductive layers is that additional manufacturing steps are imposed as compared to use of a single conductive layer. Furthermore, the preferred stud metallurgy described involves two separate depositions of Cu and Ni/Au, and an additional resist mask is likely to be needed to cap the Cu stud with a Ni/Au diffusion barrier, thereby further increasing manufacturing costs. A preferred fabrication process would employ only a single conductive layer onto which a single conductive material may be used as the solder receiving stud. This can be achieved, for example, with a transfer substrate 80 as shown in FIG. 7. A process 90 for forming transfer substrate 80 is provided in FIG. 8 in the form of a flow diagram.

Figure 8:
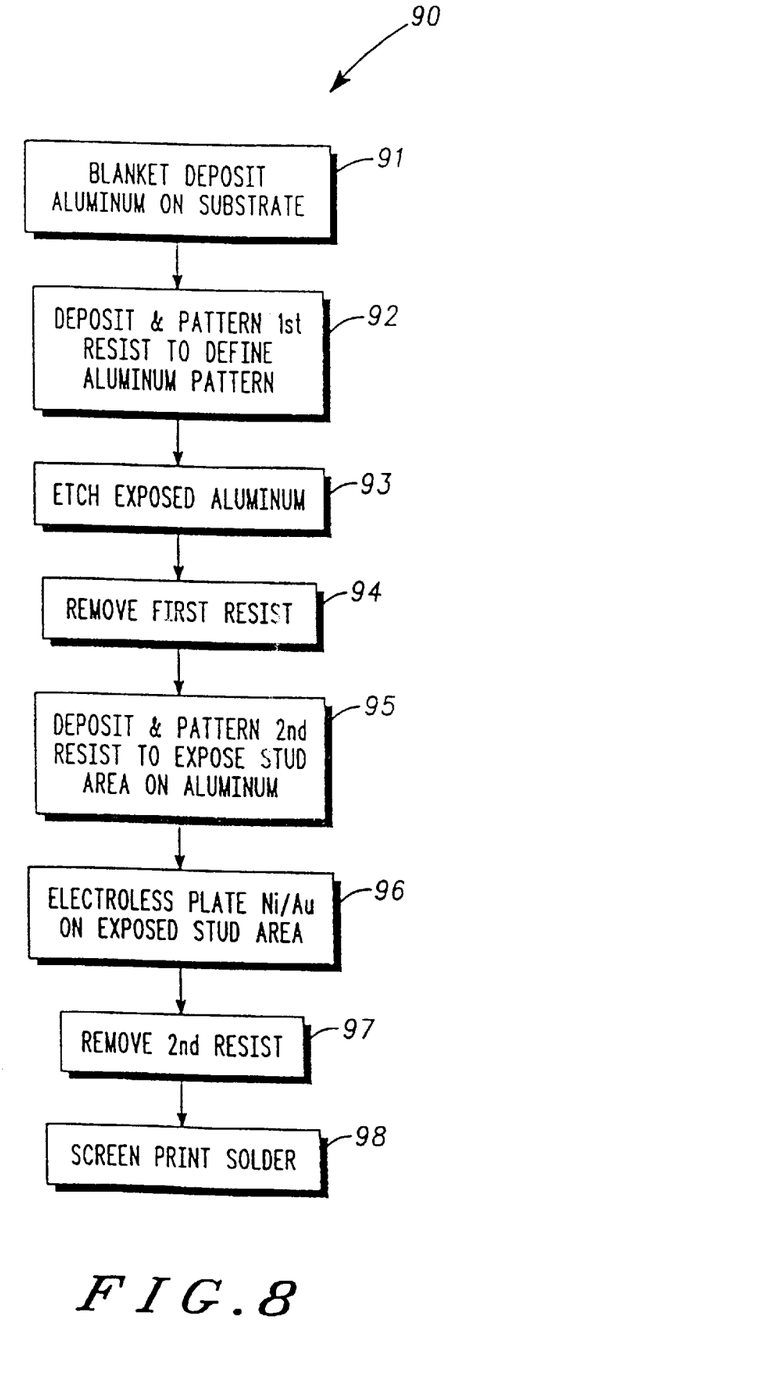
FIG. 8 is a flow-diagram showing steps suitable for forming the solder transfer substrate of FIG. 7.

As in the previous embodiment, an underlying substrate material 12 is provided. A conductive layer 82 is then blanketly deposited over the substrate, as indicated by a step 91. In this embodiment, aluminum (Al) is preferably used as conductive layer 82, or aluminum doped with small quantities of silicon (Si) and/or Cu. Aluminum is a good conductor for purposes of providing electrical routing on the transfer substrate, and is sufficiently non-wettable by Pb/Sn. A suitable deposition thickness for the aluminum layer is also 2–5 μm. After depositing conductive layer 82, the layer is patterned to form the appropriate trace pattern. Patterning is achieved by forming a resist mask on the conductive layer 82, as in a step 92, and etching away the exposed conductive material, as in step 93. In the case of using aluminum, any of the traditional dry etches with a chlorine-based chemistry used within the semiconductor industry is suitable. After etching the conductive layer, the resist mask is removed, as in step 94.

A second resist mask is then deposited and patterned on the substrate to expose that portion of the conductive layer on which the solder receiving stud will be formed, as indicated by a step 95. A solder receiving stud 84 is then formed on the exposed areas of conductive layer 82, as indicated in a step 96 of FIG. 8. Preferably, the stud is formed by using a Ni/Au electroless plating process. Again, the thickness of solder receiving stud 84 should be approximately 5–10 μm. After forming solder receiving stud 84, the resist mask used to define the stud area is removed, as indicated by a step 97.

Thereafter, the process for completing transfer substrate 80 continues as previously described in reference to transfer substrate 10. Solder bumps are formed on the solder receiving studs, and again a screen printing of Pb/Sn solder is preferred as indicated in a step 98. If a passivation layer is desired in this embodiment, it is preferably that it be deposited and pattern after defining the aluminum pattern, but before formation of the solder receiving stud (i.e. between steps 94 and 95).

The embodiment of the present invention described in reference to FIGS. 7–8 has advantages over the embodiment described in reference to FIGS. 1–6. More specifically, the number of manufacturing steps to make the transfer substrate are reduced. Only one conductive layer is used to route traces on the substrate, as compared to two. Furthermore, use of a Ni/Au stud eliminates the need for an additional diffusion barrier layer on the stud. Also, the "front-end" and "back-end" manufacturing stages can be better integrate because solder receiving stud 84 can be formed by an electroless plating process. Accordingly, the underlying conductive layer can more suitably be patterned prior to forming stud, and any passivation layer can likewise by formed prior to forming the stud.

Figure 9:
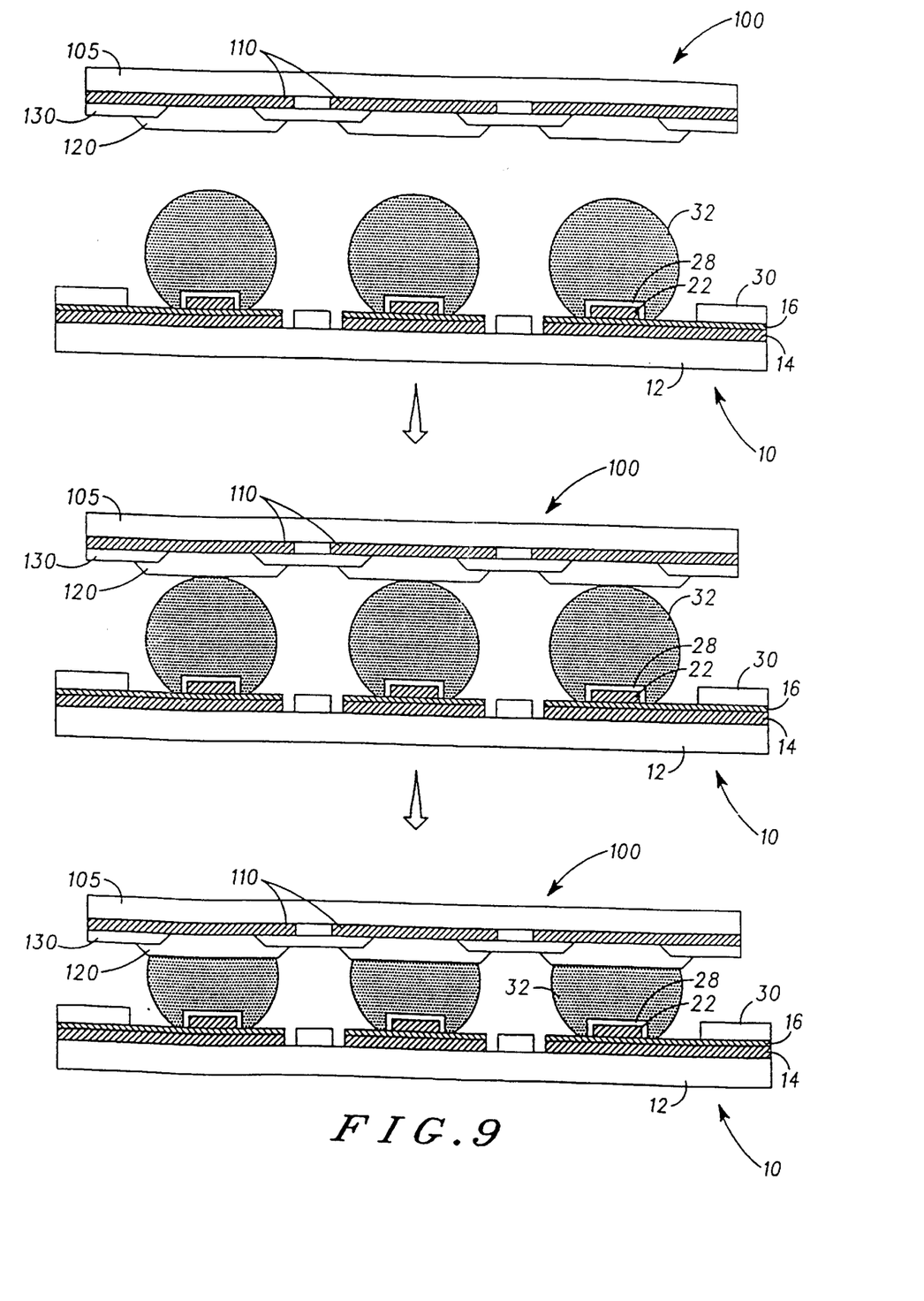
FIGS. 9–10 are cross-sectional illustrations demonstrating how the solder transfer substrate of FIG. 1 is used to test a semiconductor device, and how a transfer of the solder from the transfer substrate to the semiconductor device is accomplished.
Figure 10:
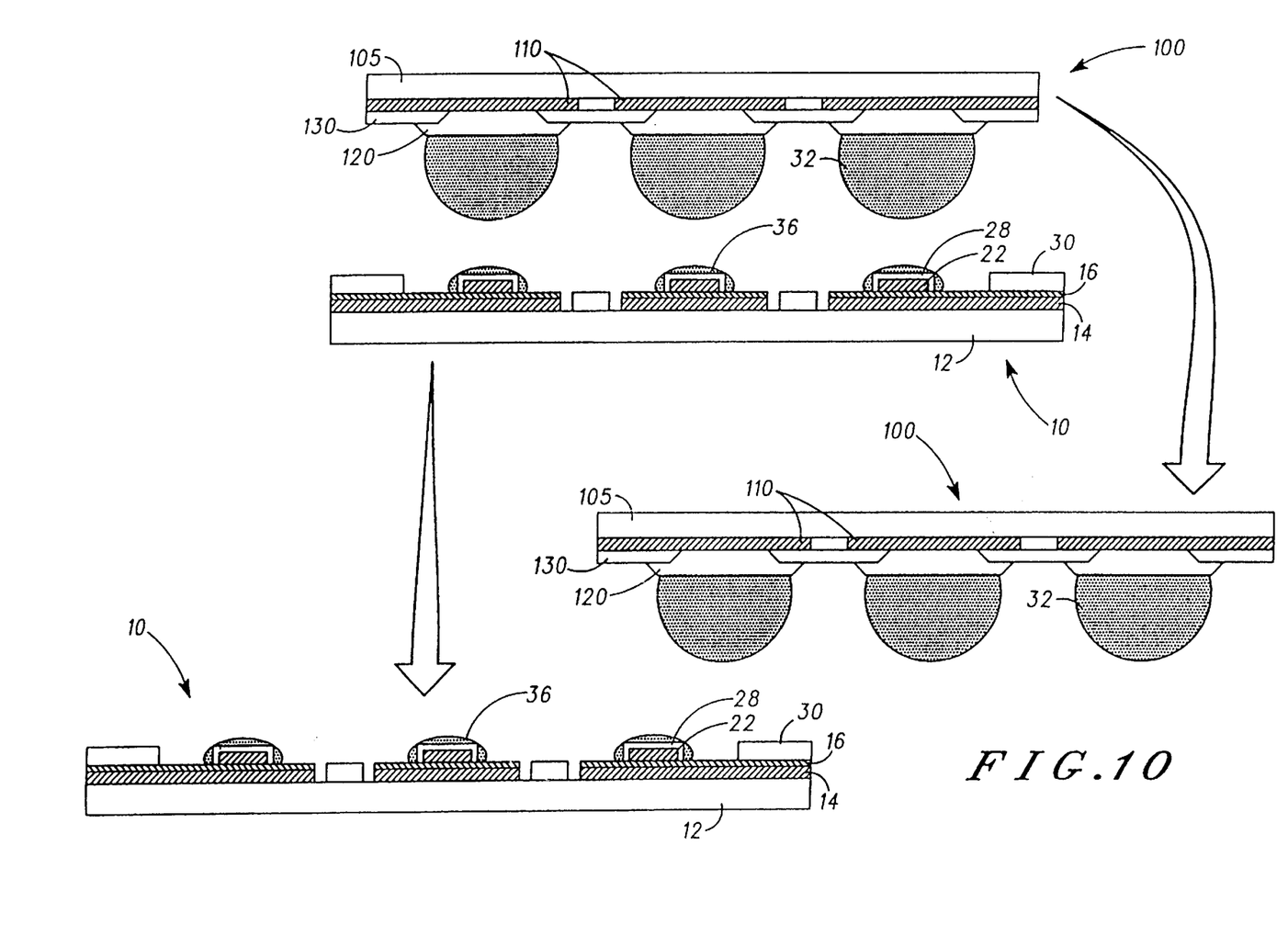

FIGS. 9–10 illustrate the manner in which a transfer substrate in accordance with the present invention can be used to test a semiconductor device 100 and/or to transfer solder bumps to the device. As shown in these figures, transfer substrate 10 is used but any transfer substrate in accordance with the invention, including transfer substrate 80, could be used instead. It is also noted that semiconductor device 100 can be in the form of a singulated die or in wafer form. As shown, device 100 is simplified, showing only the uppermost relevant layers. More specifically, semiconductor device 100 has a conductive layer 110 which is patterned on an underlying substrate material 105. The pattern of conductive layer 110 corresponds to the I/O pattern of the device. Solder receiving studs 120 are formed on the I/O pads of conductive layer 100. As shown, studs 120 are formed within openings of a passivation layer 130; however, the studs could alternatively be formed in accordance with the same process described above for forming solder receiving studs on a transfer substrate in accordance with the present invention. In either case, the studs must be formed of a conductive material which is wettable by the solder bumps on the transfer substrate.

Underlying substrate 105 of device 100 is illustrated as a single layer for purposes of simplicity. But in practice, the device will likely be an integrated circuit containing numerous conductive and dielectric layers and elements formed on a semiconductor substrate, e.g. silicon or gallium arsenide, to form thousands or even millions of transistors, resistors, capacitors and/or other individual active or passive devices. Because these underlying layers are not important for purposes of understanding the present invention, the layers are compositely illustrated as a single underlying substrate material 105.

As shown in FIG. 9, semiconductor device 100 is positioned adjacent transfer substrate 10 such that solder receiving studs 120 of the semiconductor device align in position with solder bumps 32 of the transfer substrate. Once aligned, the semiconductor device and transfer substrate are brought together to establish a physical contact between the solder bumps and the corresponding solder receiving studs of the semiconductor device. Next, the structure is heated to a temperature sufficient to melt the solder. In a liquidus state, the solder will wet the surface of the solder receiving studs as shown in FIG. 9. Alternatively, the solder bumps could be heated to a liquidus state prior to making physical contact with the solder receiving studs of the receiving substrate, then upon making contact the solder will wet the stud surface. Upon cooling the solder, a physical and electrical connection will made between the solder receiving studs on the transfer substrate and those on the semiconductor device.

The transfer substrate can then be used to test the semiconductor device, using the conductive traces formed by conductive layers 14 and 16 to route electrical signals. Testing can take the form of burn-in testing, opens-shorts testing, functional testing, or the like, depending upon the semiconductor manufacturer's or customer's requirements.

After testing, the structure is again heated to melt the solder, and the semiconductor device and transfer substrate are separated from one another, as shown in FIG. 10. Upon separation, the majority of the solder material will remain with the whichever solder receiving stud has the larger surface area. Thus, if one desires to transfer the solder to the semiconductor device, solder receiving studs 120 should be made larger in area than solder receiving studs 22. As an example, if the size of the stud on the transfer substrate is 2000 $\mu m2$, then a suitable size for the studs on the semiconductor device to facilitate transfer of the solder bumps to the device is about 8000 $\mu m2$. The resulting semiconductor device 100 is now a bumped device which has been tested and can be sold as known-good-die (KGD). After solder transfer, the transfer substrate be cleaned and reused to test and/or transfer solder bumps to another device. Note that a residual amount of solder may remain on the smaller of the two studs after a solder transfer, as also shown in FIG. 10. However, such residual solder is not problematic because the amount is so small (e.g. about 1 $\mu m$) and can simply be screen printed over when forming new bumps on the transfer substrate.

The foregoing description and illustrations contained herein demonstrate many of the advantages associated with the present invention. In particular, it has been revealed that a transfer substrate can be manufactured and used for transferring solder to a semiconductor which also facilitates testing of the device. The bulk transfer substrate material, preferably being of glass or silicon, has a CTE very similar to the actual device being testing and one can maintain appropriate contact during testing at even elevated temperatures. Furthermore, the transfer substrate can be reused after testing and solder transfer to keep semiconductor manufacturing costs low. Another advantage of the invention is that testing can be performed at either the die or wafer level, and the entire wafer can be testing at once. Also, the substrate can be used in conjunction with any type of solder deposition process, included the preferred, low-cost screen-printing technique. Moreover, solder compositions can be used for which no plating method exists because the invention enables use of stencil printing for the solder deposition.

Thus, it is apparent that there has been provided, in accordance with the invention, a method for transferring solder to a device, and transfer substrate used in the same, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present transfer substrate herein described need not be used for both solder bump transfer and testing. The substrate can be used solely for solder bump transfer, in which case electrical routing on the substrate is not required. Alternatively, the transfer substrate could be used only for testing, in which case the solder receiving studs on the "transfer" substrate (really then a testing substrate) should be made larger than those on the semiconductor wafer so that the liquidus solder will remain on the "transfer" substrate upon separation from the semiconductor device. Moreover, the substrate could be used to test devices which are already bumped, or already packaged as if using the substrate in place of a socket. In addition, the invention is not limited to the transfer of solder to a semiconductor device, but instead can be used to transfer solder bumps to any article. It is also important to note that the present invention is not limited in any way to the size of the transfer substrate relative to the receiving substrate. The transfer substrate could be approximately the same size, or could be larger to accommodate the required number of electrical routing paths. Nor is the invention limited to the particular dimensions or materials described. Therefore, it is intended that this invention encompass all such variations and modifications as fall within the scope of the appended claims.

What is claimed is:

1. A method for transferring a solder to a receiving substrate comprising the steps of:
   providing a transfer substrate, the transfer substrate having:
      an insulating layer;
      a conductive layer formed over the insulating layer, the conductive layer being non-wettable by the solder;
      a solder receiving stud formed on the conductive layer, the solder receiving stud being formed of a conductive material which is wettable by the solder, the solder receiving stud having a first area; and
   forming a solder bump on the solder receiving stud, by screen printing the solder onto the solder receiving stud to obtain screen printed solder, and reflowing the screen printed solder;
   providing the receiving substrate, the receiving substrate having a solder accepting stud formed of a conductive material, the conductive material being wettable by the solder, the solder accepting stud having a second area which is greater than the first area;
   making physical contact between the solder bump of the transfer substrate and the solder accepting stud of the receiving substrate while the solder bump is in a liquidus state; and
   subsequently, separating the transfer substrate from the receiving substrate, leaving a majority of the solder bump on the solder accepting stud of the receiving substrate.

2. The method of claim 1 further comprising the step of reusing the transfer substrate to transfer another solder bump to another receiving substrate.

3. The method of claim 1 further comprising the step of cooling the solder bump subsequent to the step of making physical contact and prior to the step of separating the transfer substrate from the receiving substrate.

4. The method of claim 3 wherein the receiving substrate comprises a semiconductor device, and further comprising the step of testing the semiconductor device after the step of cooling the solder bump and prior to the step of separating the transfer substrate from the receiving substrate.

5. The method of claim 4 wherein the semiconductor device is part of a semiconductor wafer.

6. The method of claim 4 wherein the semiconductor device is a semiconductor die which has been singulated from a semiconductor wafer.

7. A method for making a transfer substrate useful for transferring a solder to a receiving substrate, comprising the steps of:
   providing a rigid semiconductor substrate;
   providing an insulating layer of oxide on the rigid semiconductor substrate;
   depositing a conductive layer over the insulating layer, wherein the conductive layer is non-wettable by the solder;
   providing a mask which exposes a portion of the conductive layer;
   forming a solder receiving stud on the exposed portion of the conductive layer, wherein the solder receiving stud is formed of a conductive material which is wettable by the solder; and
   providing a solder bump formed of the solder and on the solder receiving stud, wherein the solder bump is formed by screen printing the solder onto the solder receiving stud, and reflowing the screen printed solder such that the solder bump is formed on the solder receiving stud, while the non-wettable surface of the conductive layer is substantially free of solder.

8. The method of claim 7 wherein the conductive layer comprises aluminum and the solder receiving stud of the transfer substrate comprises nickel.

9. The method of claim 7 wherein the conductive layer comprises titanium tungsten and the solder receiving stud of the transfer substrate comprises copper.

10. A method for testing a semiconductor device comprising the steps of:
   providing a testing substrate, the testing substrate having:
      an insulating layer;
      a conductive layer formed over the insulating layer, the conductive layer being non-wettable by a solder; and
      a solder accepting stud having a first area, the solder accepting stud being formed on the conductive layer, the solder accepting stud being formed of a conductive material, the conductive material being wettable by the solder;
   forming a solder bump formed on the solder receiving stud by screen printing the solder onto the solder receiving stud to obtain screen printed solder, and reflowing the screen printed solder;
   providing the semiconductor device to be tested, the semiconductor device having a solder receiving stud, the solder receiving stud having a second area being smaller than the first area;
   making physical contact between the solder bump of the testing substrate and the solder accepting stud of the semiconductor device while the solder bump is in a liquidus state;
   cooling the solder bump;
   testing the semiconductor device by sending test signals to the semiconductor device using the testing substrate; and
   subsequently, separating the testing substrate from the semiconductor device, leaving a majority of the solder bump on the solder receiving stud of the testing substrate.

* * * * *